(12) United States Patent
Yazawa et al.

(10) Patent No.: US 11,832,518 B2
(45) Date of Patent: Nov. 28, 2023

(54) WOVEN THERMOELECTRIC RIBBON

(71) Applicants: Purdue Research Foundation, West Lafayette, IN (US); KARLSRUHE INSTITUTE OF TECHNOLOGY, Karlsruhe (DE)

(72) Inventors: Kazuaki Yazawa, West Lafayette, IN (US); Ali Shakouri, West Lafayette, IN (US); Ulrich Lemmer, Karlsruhe (DE); Andres Georg Roesch, Karlsruhe (DE)

(73) Assignee: Purdue Research Foundation, West Lafayette, IN (US)

( * ) Notice: Subject to any disclaimer, the term of this patent is extended or adjusted under 35 U.S.C. 154(b) by 0 days.

(21) Appl. No.: 17/592,885

(22) Filed: Feb. 4, 2022

(65) Prior Publication Data

US 2022/0246819 A1    Aug. 4, 2022

Related U.S. Application Data

(60) Provisional application No. 63/145,828, filed on Feb. 4, 2021.

(51) Int. Cl.
*H10N 10/17* (2023.01)
*D03D 15/533* (2021.01)
(Continued)

(52) U.S. Cl.
CPC ........... *H10N 10/17* (2023.02); *D03D 1/0088* (2013.01); *D03D 3/005* (2013.01); *D03D 15/533* (2021.01)

(58) Field of Classification Search
CPC .... D03D 15/533; D03D 1/0088; D03D 3/005; H10N 10/17
See application file for complete search history.

(56) References Cited

U.S. PATENT DOCUMENTS

| 2,519,785 A | 8/1950 | Okolicsanyi |
| 3,554,815 A | 1/1971 | Osborn |

(Continued)

FOREIGN PATENT DOCUMENTS

| CH | 413018 A | 5/1966 |
| DE | 2002197 A1 | 8/1970 |

(Continued)

*Primary Examiner* — Tamir Ayad
(74) *Attorney, Agent, or Firm* — Maginot, Moore & Beck LLP

(57) ABSTRACT

A woven structure includes thermoelectric ribbons interwoven with thread. Each thermoelectric ribbon includes a folded matrix of thermoelectric elements, the matrix having an insulating substrate that supports plural rows of thermoelectric elements, a plurality of conductive elements, and two terminals. The conductive elements form a series connection of the thermoelectric elements between the two terminals. A set of first conductive elements have a first temperature and a set of second conductive contacts have a second temperature lower than the first temperature when a first current flows in a first direction between the first matrix terminal and the second matrix terminal. The folded matrix is configured to form spaced-apart alternating stacks of the first conductive contacts and second conductive contacts. Each length of the yard or thread is interwoven such that it passes alternately under stacks of first conductive contacts and over stacks of second conductive contacts.

12 Claims, 5 Drawing Sheets

(51) Int. Cl.
*D03D 1/00* (2006.01)
*D03D 3/00* (2006.01)

(56) References Cited

U.S. PATENT DOCUMENTS

| | | |
|---|---|---|
| 3,740,273 A | 6/1973 | Adler et al. |
| 3,981,751 A | 9/1976 | Dashevsky et al. |
| 9,660,167 B2 | 5/2017 | Lemmer et al. |
| 2004/0075167 A1 | 4/2004 | Nurnus et al. |
| 2005/0115601 A1* | 6/2005 | Olsen .................. H01L 35/16 136/211 |
| 2008/0173537 A1 | 7/2008 | DeSteese et al. |
| 2009/0025774 A1* | 1/2009 | Plissonnier ............ H01L 35/32 136/238 |
| 2009/0314324 A1 | 12/2009 | Murai et al. |
| 2011/0214707 A1 | 9/2011 | Suzuki et al. |
| 2013/0087180 A1 | 4/2013 | Stark et al. |
| 2015/0311421 A1 | 10/2015 | Jur et al. |
| 2018/0240956 A1 | 8/2018 | Yazawa et al. |

FOREIGN PATENT DOCUMENTS

| | | |
|---|---|---|
| DE | 10122679 A1 | 12/2002 |
| FR | 2620573 A1 | 3/1989 |
| GB | 1021486 A | 3/1966 |
| JP | 2006100346 A | 4/2006 |
| JP | 2006269721 A | 10/2006 |
| JP | 2008130594 A | 6/2008 |
| WO | 0223642 A2 | 3/2002 |
| WO | 2004105146 A1 | 12/2004 |
| WO | 2005117154 A1 | 12/2005 |

* cited by examiner

WOVEN THERMOELECTRIC RIBBON

This application claims the benefit of U.S. Provisional Patent Application Ser. No. 63/145,828, filed Feb. 4, 2021, the entirety of which is incorporated herein by reference.

FIELD OF THE INVENTION

The present invention relates generally to thermoelectric systems.

BACKGROUND

Thermoelectric semiconductors can create a temperature gradient based on an applied electric current, and conversely, can generate an electric current in response to an external temperature gradient. For example, FIG. 1 shows a typical prior art thermoelectric system.

In the exemplary embodiment of FIG. 1, the thermoelectric module 18 includes two insulating substrates 11, 12, plural electrodes 21, 22, and a plurality of thermoelectric elements, such as, for example, Peltier elements 30, 31. The electrodes 21, 22 are formed on the insulating substrates 11, 12 respectively. The plural Peltier elements 30, 31 are mounted to each of electrodes 21, 22, which in turn are mounted to the surfaces 11a, 12a of the two substrates 11, 12. The Peltier elements 30 are formed as P-type Peltier elements and the Peltier elements 31 are formed as N-type Peltier elements. As illustrated in FIG. 1, each of the Peltier elements are connected so that the P-type Peltier elements 30 and the N-type Peltier elements 31 are arranged alternately in series via the electrodes 21 and the electrodes 22.

The plurality of Peltier elements 30, 31 are series connected (as described above) by alternating doping type between first and second electrical terminals 26, 28. The device creates a temperature gradient (difference in temperature between the substrates 11, 12 in response to a voltage applied across the first and second terminals 26 and 28. Because the current flows in all of the P-type elements 30 in the same direction between the substrates 11, 12, and because the current flows in all of the N-type element 31 in the opposite direction between the substrate 11, 12, all of the elements 30, 31 contribute cooperatively to the temperature difference between substrates 11, 12.

Such operation is known in the art. However, the prior art device shown in FIG. 1 can be difficult to produce, and the rigid substrates 11, 12 are not suitable for many applications.

There is a need for more flexible thermoelectric systems.

SUMMARY

At least some embodiments of the invention include thermoelectric fabric formed from a plurality of ribbon thermoelectric modules that are interwoven with insulating threads. The insulating threads provide flexible, structural support that allows the system to be incorporated directly into articles of clothing or other cloth products.

A first embodiment is a woven structure than includes thermoelectric ribbons interwoven with thread. Each thermoelectric ribbon includes a folded matrix of thermoelectric elements, the matrix having an insulating substrate that supports plural rows of thermoelectric elements, a plurality of conductive elements, and two terminals. The conductive elements form a series connection of the thermoelectric elements between the two terminals. A set of first conductive elements have a first temperature and a set of second conductive contacts have a second temperature lower than the first temperature when a first current flows in a first direction between the first matrix terminal and the second matrix terminal. The folded matrix is configured to form spaced-apart alternating stacks of the first conductive contacts and second conductive contacts. Each length of the yard or thread is interwoven such that it passes alternately under stacks of first conductive contacts and over stacks of second conductive contacts.

The woven structure may operate to provide heating or cooling by placing the appropriate surface of the thermoelectric fabric on against the body or element to be heated or cooled. Alternatively, the thermoelectric system may be used as a source of power, by placing the thermoelectric fabric between two interfaces having a temperature difference, for example, between the surface of a human body and the ambient air, when the ambient air has a temperature below the surface temperature of the human body.

The above-described features and advantages, as well as others, will become more readily apparent to those of ordinary skill in the art by reference to the following detailed description and accompanying drawings.

DETAILED DESCRIPTION

Figure 2:
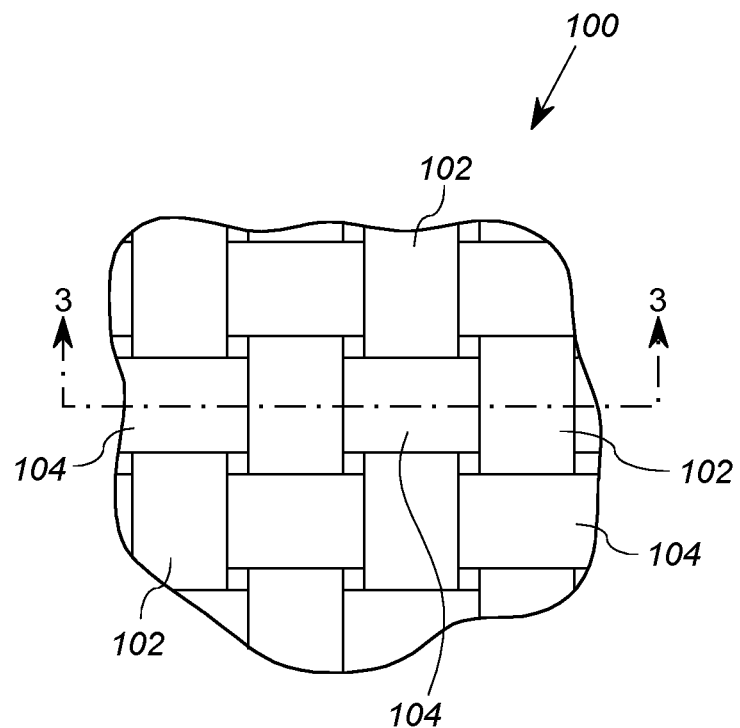
FIG. 2 shows a fragmentary view of a swath of woven thermoelectric structure according to at least a first embodiment.

In general, FIG. 2 shows top plan view of a small swath of woven material or fabric 100 formed of insulating threads 102 interwoven with thermoelectric ribbons 104 according to a first embodiment. The woven material 100 may be implemented as an article of clothing, or a portion thereof. The insulating threads 102 may suitably be formed of acrylic or other yarn material. The thermoelectric ribbons 104 are ribbons formed as will be discussed below.

Figure 3:
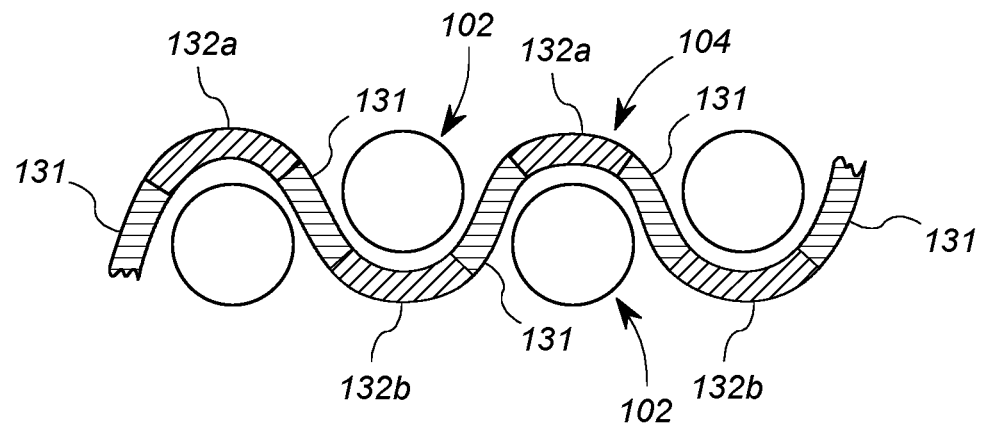
FIG. 3 shows a cross-sectional view of the woven thermoelectric structure of FIG. 2.

FIG. 3 shows a representative cross-section of the woven fabric of FIG. 2. The thermoelectric ribbon 104 includes alternating conductive element stacks 132a or 132b and thermoelectric element stacks 131. As will be discussed below, the weaving of the thermoelectric ribbons 104 is arranged to ensure a predetermined, coordinated orientation of the thermoelectric elements thereon.

Referring to FIGS. 2 and 3, the thermoelectric ribbons 104 are preferably multilayer, flexible sheets having a plurality of thermoelectric elements formed thereon. Each of the plurality of thermoelectric ribbons 104 includes a folded matrix 106 of thermoelectric elements 110, 112, creating the alternating thermoelectric element stacks 131 and conductive element stacks 132a or 132b.

Figure 4:
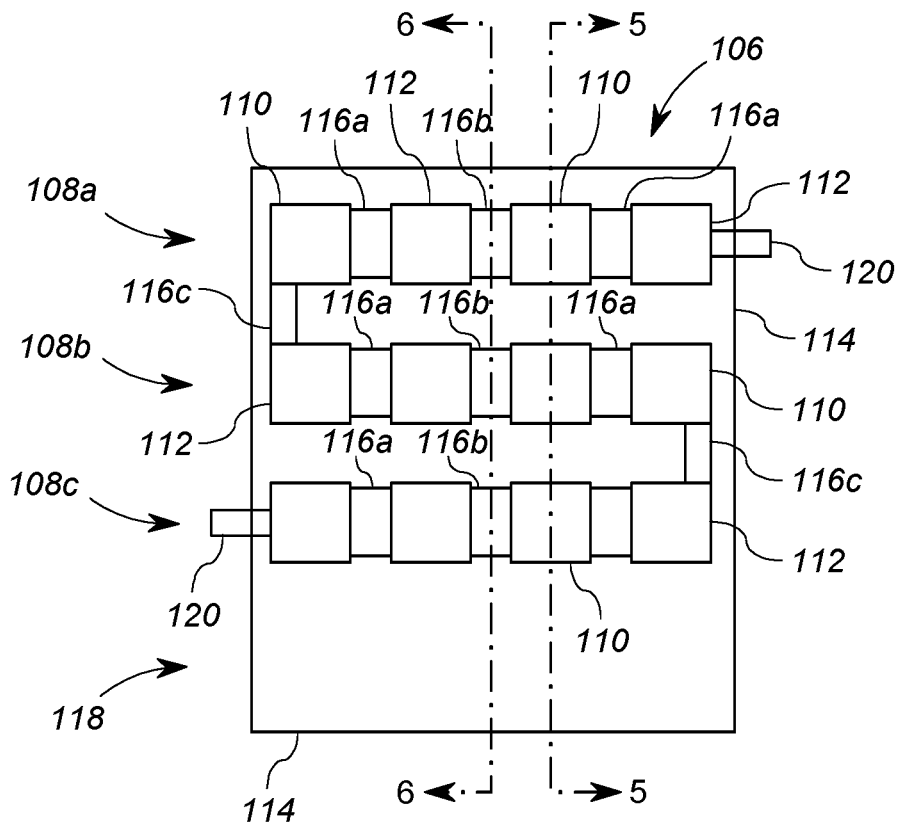
FIG. 4 shows a top plan view of a matrix that may be folded into a thermoelectric ribbon used in the woven thermoelectric structure of FIG. 2.

For example, FIG. 4 shows an exemplary matrix 106 (in an unfolded state) that is used to form an exemplary ribbon 104. The ribbon 104, of course, may be scaled to much larger lengths by corresponding scaling of the matrix 106, or by daisy-chaining multiple matrices 106, as will be discussed further below in connection with FIGS. 8 to 10. The ribbon 104 in this embodiment constitutes a folded version of the matrix 106.

Figures 5, 6:
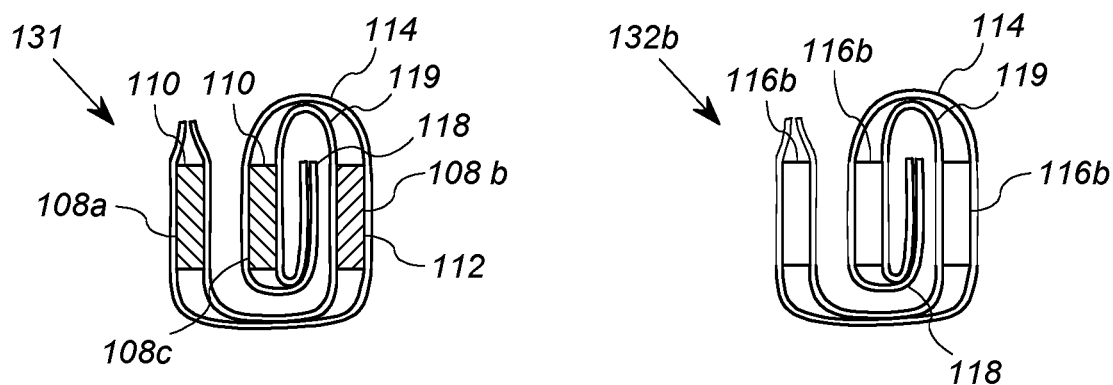
FIG. 5 shows a first cross-sectional view of the thermoelectric ribbon of the woven thermoelectric of FIG. 2.
FIG. 6 shows a second cross-sectional view of the thermoelectric ribbon of the woven thermoelectric of FIG. 2.

The matrix 106 in this embodiment includes comprising a flexible, insulating substrate 114, three rows 108a, 108b, and 108c of thermoelectric elements 110, 112, a plurality of conductive elements 116a, 116b, and 116c, a first matrix terminal 120 and a second matrix terminal 122. Each of the three rows 108a, 108b, and 108c of thermoelectric elements 110, 112, the conductive elements 116a, 116b, and 116c, and matrix terminals 120, 122 are disposed on the flexible insulating substrate 114. The substrate may suitably made from polyethylene, and in this embodiment has a thickness of one micron or less. A second substrate, not shown in FIG. 4, but see FIGS. 5 and 6, is preferably also disposed over the matrix 106, for example, by laminating polyethylene over the substrate 114, the conductive elements 116a, 116b, and 116c, and the thermoelectric elements 110, 112.

The thermoelectric elements 110, 112 are preferably semiconductors configured to create a temperature gradient based on an applied electric current therethrough, and conversely, to generate an electric current therethrough in response to an external temperature gradient. In this embodiment, the thermoelectric (TE) elements include n-type elements 110, and p-type elements 112. In this embodiment, each of the thermoelectric elements 110, 112 has a length and width of about 20 to 100 microns, and a thickness of 2 to 10 microns.

Each of the three rows 108a, 108b, 108c has alternating p-type thermoelectric (TE) elements 112 and n-type thermoelectric (TE) elements 110. In this embodiment, the first row 108a has the sequence from left to right, of an n-type TE element 110, a p-type TE element 112, an n-type element 110 and a p-type element 112. The second row 108b, from left to right, has a p-type element 112, an n-type element 110, a p-type element 112 and an n-type element 110. The third row 108c has the same layout as the first row 108a. The substrate has a fourth row 118 with no thermoelectric elements.

The elements 110, 112 may be disposed on the flexible insulating substrate 114 using deposition techniques, such as depositing the elements 110, 112 on a sacrificial substrate, not shown, and then laminating substrate 114 to the resulting elements 110, 112. Alternatively, the TE elements 110, 112 may be printed on the substrate 114. U.S. Pat. No. 9,660,167, the entirety of which is incorporated herein by reference, illustrates and describes methods in which the matrix 106 can be made.

The first matrix terminal 120 and second matrix terminals 122 are electrically conductive elements that are coupled to two diametrically opposite TE elements 110, 112, or in other words, TE elements 110, 112 at opposing corners of the matrix 106. In the example of FIG. 4, the first matrix terminal 120 connects to the right-most p-type element 112 of the first row 108a, and a second matrix terminal 122 connects to the left-most n-type element 110 of the third row 108c.

In general, the conductive elements 116a, 116b, 116c are electrically and thermally conductive material disposed on the substrate 114, and are operably connected to form a series connection of the thermoelectric elements 110, 112 from the first matrix terminal 120 to the second matrix terminal 122. The conductive elements 116a, 116b, 116c are configured to connect, in each case, an n-type element 110 to a p-type element 112. The conductive elements 116a and 116b alternately connect the TE elements 110, 112 across each row. Adjacent TE elements 110, 112 are spaced apart by about 10 to 50 microns, thereby defining the length of the conductive elements 116a, 116b. The conductive elements 116a, 116b preferably have a width that approximately spans the width of the of the TE elements 110, 112.

The conductive elements 116c form a single connection between a pair of adjacent TE elements 110, 112 in each of the adjacent rows 108a, 108b and 108c, thereby completing the series electrical connection through all three rows of TE elements 110, 112.

Because of the alternating serial connection of n-type elements 110 and p-type elements 112, a set of first conductive elements 116a will have a first temperature and a set of second conductive contacts 116b will have a second temperature lower than the first temperature when a first current flows in a first direction between the first matrix terminal 120 and the second matrix terminal 122. This is due to the temperature gradient across each TE element 110, 112 that corresponds to the flow of current across each TE element 110, 112.

After the second insulating substrate is applied to the side of the matrix 106 opposite the substrate 114, the matrix 106 is then folded into the ribbon 104 by folding the insulating row 118 over the third row 108c, then folding the second row 108b over the insulating row 118, and then the first row 108a over the back of the third row 108c. The exact order of folding operations may change so long as the end result is the same. Specifically, the stack should be ordered—substrate 114, first row 108a, substrate 114, third row 108c, insulating substrate row 118, second row 108b, substrate 114. The folding step creates alternating stacks of conductive contacts and TE elements.

FIG. 5, taken from section 5-5 of FIG. 4 after folding, shows a TE element stack 131 produced by the folding step. The TE stack 131 is shown with exaggerated spaces between the layers of the TE element stack 131 for purposes of clarity of exposition, but would normally be tightly stacked. It is noted that the folding method ensures that there is part of the insulating substrate 114 separating all TE elements 110, 112 in the stack 131. As shown in FIG. 5, the second substrate 119 is disposed on the side opposite the substrate 114.

Moreover, the folded matrix 106 also forms spaced-apart alternating stacks 132a, 132b, respectively, of the first conductive contacts 116a and second conductive contacts 116b. (See also FIG. 3), with the TE stacks 131 interleaved therebetween. Thus, the pattern of the ribbon 104 is thus a repeating pattern of conductive element stack 132a, TE element stack 131, conductive element stack 132b, and TE element stack 131. The pattern may be extended to rows of alternating TE elements 110, 112 of any length.

FIG. 6, taken from section 6-6 of FIG. 4 after folding, conductive contact stack 132b formed of second conductive contacts 116b. FIG. 6 is also in exaggerated form for purposes of clarity of exposition. After the folding, the second conductive contacts 116b from the same column of the unfolded matrix 106 form a stack 132b. As shown in FIG. 6, the second substrate 119 is disposed on the side opposite the substrate 114. Corresponding stacks of first conductive elements 116a of other columns of the matrix 106 are also formed, but are not visible in FIG. 6.

Figure 7:
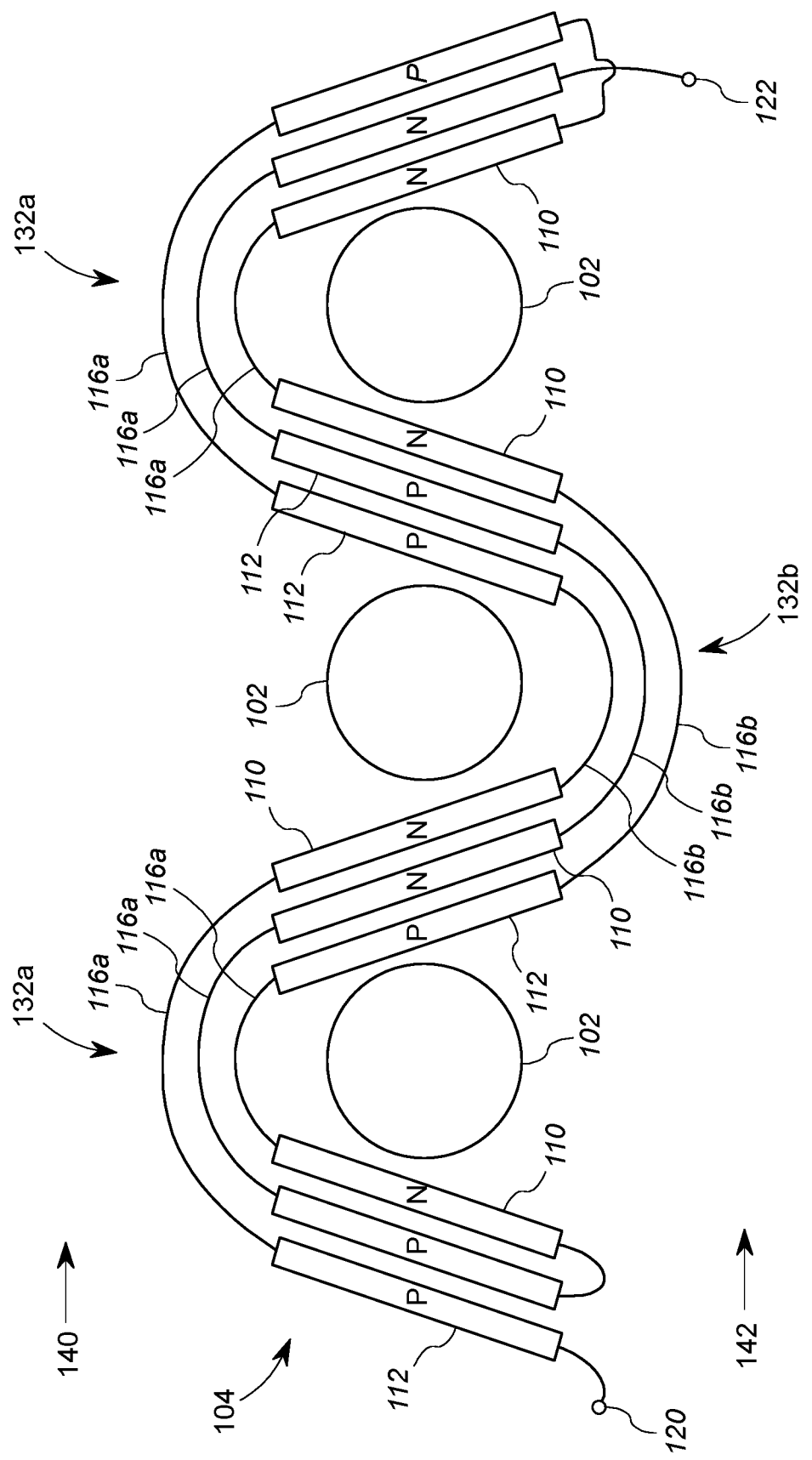
FIG. 7 shows a representative schematic diagram of a cross-section of the woven thermoelectric material of FIG. 2.

FIG. 7 shows a representative schematic cross-section woven fabric 100, showing the resulting ribbon 104 interwoven with the threads 102. The woven structure 100 has a first side 140 and a second side 142. FIG. 7 shows the woven structure 100 laid flat. However, it will be appreciated that the woven structure 100 is flexible and can have folds, wrinkles, or other draping patterns. The first side 140 and second side 142 correspondingly deform with the woven structure 100.

In the schematic diagram of the ribbon 104 in FIG. 7, it will be appreciated that the electrical elements (TE elements 110, 112, conductors 116a, 116b) are shown schematically, but the substrates 114, 119 are not shown. As shown in FIG. 7, the threads 102 and the ribbon 104 are interwoven such that the stack 132b of second conductive contacts 116b and corresponding stacks 132a of first conductive contact 116a are disposed on opposite sides 140, 142 of the woven fabric 100.

With reference to both FIGS. 2 and 7, each a plurality of threads 102 or lengths of yarns is woven into a plurality of the ribbons 104 such that in at least a portion of the woven structure, all of the first conductive contacts 116a are nearer the first surface 140 than the second surface 142, and all of the second conductive contacts 116b are nearer the second surface 142 than the first surface 140. Thus, the ribbons 104 are woven with the plurality of threads 102 such that the threads 102 create a vertical separation between a first side to a second side of each of the p-type thermoelectric elements 112 and n-type thermoelectric elements 110. The threads 102 in this embodiment have a nominal diameter configured to create such vertical separation, which depends on the lengths of the conductive contacts 116a, 116b and the TE elements 110, 112. In general, the threads 102 will have a diameter of about 10 to 100 microns.

Figure 1:
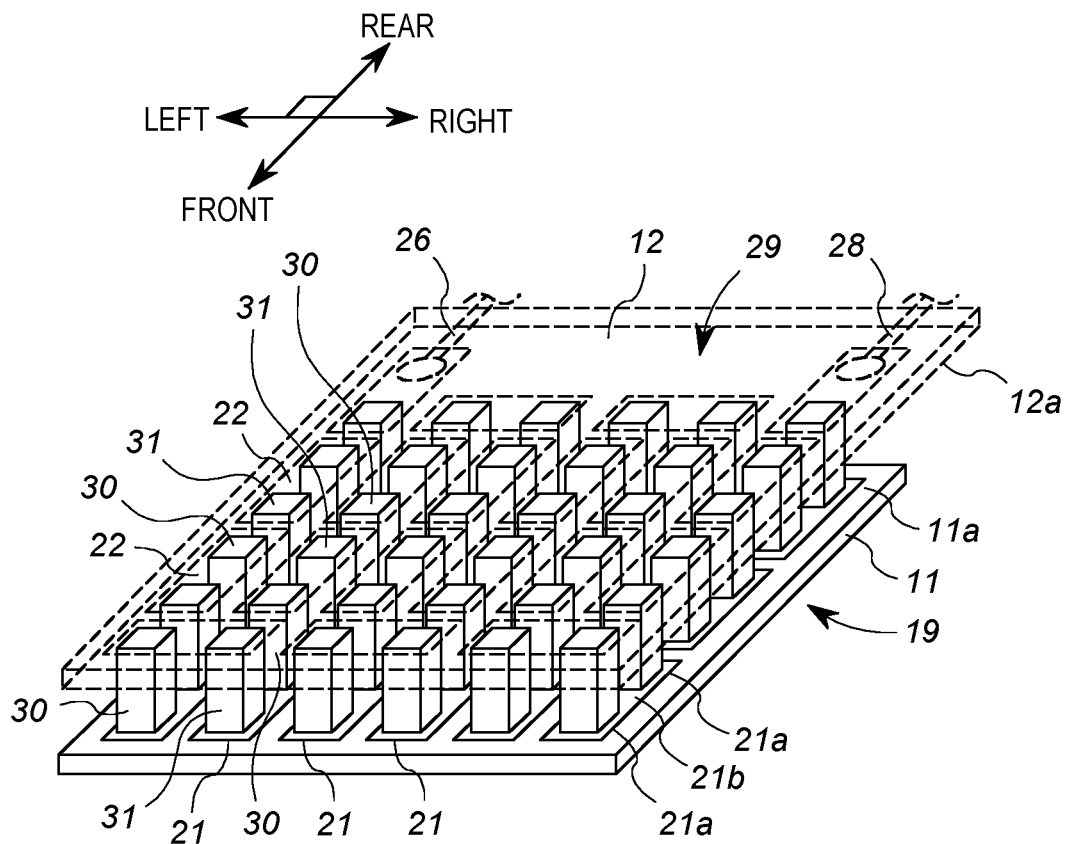
FIG. 1 shows a prior art thermoelectric module.

Due to the nature of the TE elements 110, 112 and the weave of the structure 100, the woven structure 100 can be thought as having a heating first side 140 and a cooling second side 142. Because of the vertical separation and also the orientation of the elements 110, 112, in the weave, and their connection pattern which is analogous to that shown in FIG. 1, current will flow through the n-type elements 110 and the p-type elements 112 to create a temperate gradient in the n-type elements 110 and p-type elements 112 in the same direction.

The resulting woven material or fabric 100 may be scaled to any appropriate size, and is flexible and conforming the surface on which it is applied. This makes the fabric 100 particularly suitable for clothing. If the fabric 100 is disposed against the skin of a living being having a temperature warmer than the ambient temperature, then thermoelectric ribbon can produce a current between the first matrix terminal 120 and second matrix terminal 122, for example, to help power a load. Applying external electrical power to the first matrix terminal 120 and second matrix terminal 122, by contrast, can be used to help heat or cool the skin of the living being wearing the fabric is 100.

As a practical matter, the TE ribbon 104 should be elongated to including many more TE elements 110, 112. As discussed above, this can be done by extending the length of the rows 108a, 108b and 108c matrix 106 to including many more alternating TE elements 110, 112 and corresponding contacts 116a, 116b. In the alternative, or in addition, the TE ribbon 104 may be lengthened by including multiple interconnected matrices 106.

Figure 8:
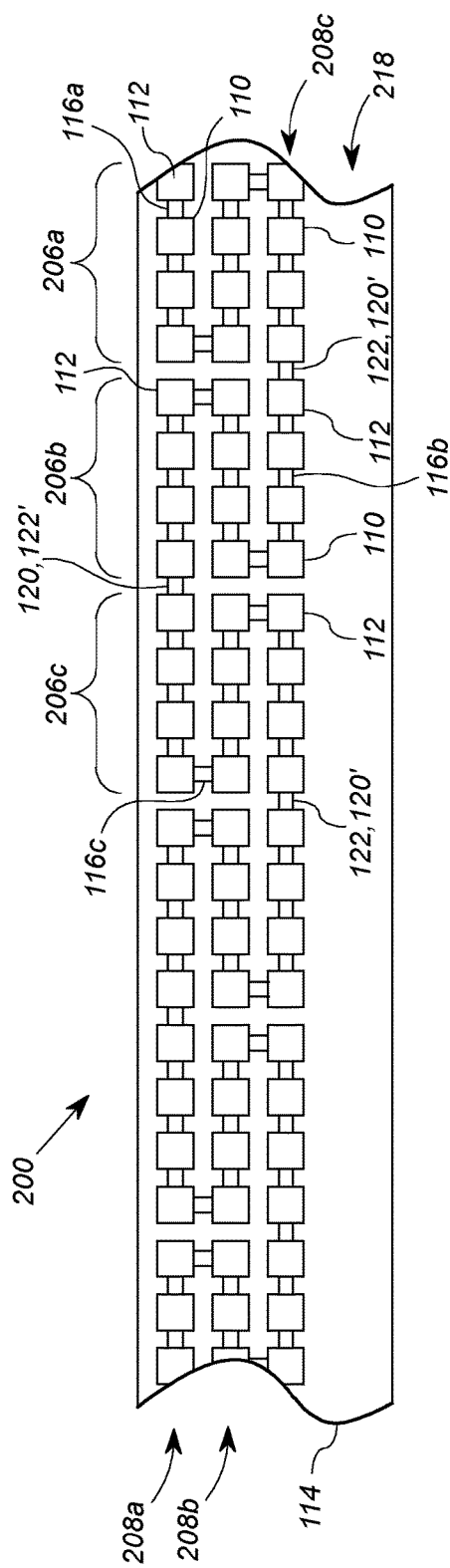
FIG. 8 shows a top plan view of a tape that may be cut and folded into a thermoelectric ribbon of desired length.

For example, in one embodiment, a method of making a woven structure involves having an elongated sheet or tape of matrices. FIG. 8 shows an elongated sheet 200 having a plurality of series connected matrices 206a, 206b, 206c, and so forth, of series-connected TE elements. Each of the matrices 206a, 206b, 206c and so forth has substantially the structure of the unfolded matrix 106 of FIGS. 4 to 6, including multiple rows of series-connected of TE elements 110, 112. The matrices 206a, 206b, 206c and so forth and a single substrate 114 of the tape 200.

The only difference in the matrices 206a, 206b, 206c and so forth is that every other matrix has a first matrix terminal 120' connected to its lower right-hand p-type TE element 112 and its second matrix terminal 122' connected to its upper left-hand n-type TE element 110, as opposed to the configuration of the matrix 106. As such, the first matrix terminal 120 of every matrix (e.g. matrix 206c) having the structure of the matrix 106 connects or also forms the second matrix terminal 122' an adjacent matrix (e.g. matrix 206b), and the second matrix terminal 122 of matrices (e.g. matrix 206a) having the structure of the matrix 106 connects or also forms the first matrix terminal 120' of the adjacent matrix (e.g. matrix 206b). In this way, the matrices 206a, 206b, 206c, and so forth, may be serially connected to each other, as shown in FIG. 8.

Collectively, the matrices 206a, 206b, 206c, and so forth, form four rows. The first row 208a includes all of the rows corresponding to row 108a of matrices 206a, 206b, 206c, and so forth, the second row 208b includes all of the rows corresponding to row 108b of matrices 206a, 206b, 206c and so forth, and the third row 208c includes all of the rows corresponding to row 108c of matrices 206a, 206b, 206c and so forth. Likewise, the insulating row 218 corresponds to the all of the rows 118 of the matrices 206a, 206b, 206c, and so forth.

Figure 9:
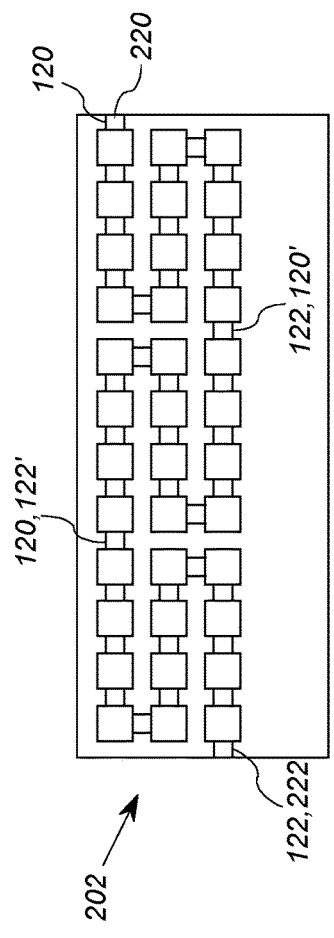
FIG. 9 shows a top plan view of a section of the tape of FIG. 8 cut to an exemplary desired length.

After the tape 200 of serially connected matrices 206a, 206b, 206c and so forth is provided, a section of the tape 200 of desired length is cut. FIG. 9 shows a section 202 of the desired length, which includes three matrices 206a, 206b, and 206c. The first matrix terminal 120 of the first matrix 206a forms the first ribbon terminal 220, and the second matrix terminal 122 of the last matrix 206c forms the second ribbon terminal 222. A series connection of alternating n-type TE elements 110 and p-type TE elements 112 is thereby formed from the first ribbon terminal 220 to the second ribbon terminal 222. It will be appreciated that the desired length may have more or fewer matrices. After the section 202 is cut to the desired size, the entire section is folded in the manner described above in connection with FIGS. 4, 5 and 6.

Figure 10:
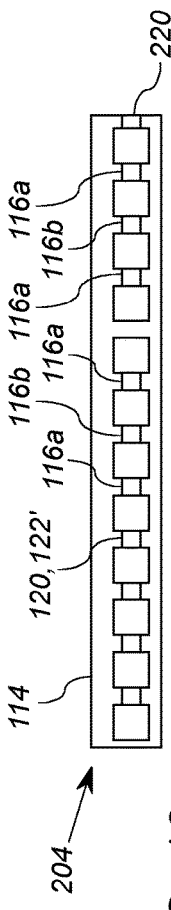
FIG. 10 shows a top plan view of a thermoelectric ribbon formed from the section of tape shown in FIG. 9.

Specifically, the section 202 is then folded into an elongate TE ribbon 204 by folding the insulating row 218 over the third row 208c, then folding the second row 208b over the insulating row 218, and then the first row 208a over the back of the third row 208c. The exact order of folding operations may change so long as the end result is the same. Specifically, the stack should be ordered—substrate 114, first row 208a, substrate 114, third row 208c, insulating substrate row 218, second row 208b, substrate 114. FIG. 10 show a top plan view of the resulting thread.

It will be appreciated that the above-described embodiments are merely illustrative, and that those of ordinary skill in the art may readily devise their own modifications and implementations that incorporate the principles of the present invention and fall within the spirit and scope thereof.

The invention claimed is:
1. A woven structure comprising:
a plurality of thermoelectric ribbons interwoven with yarn or thread, each of the plurality of thermoelectric ribbons comprising a folded matrix, the folded matrix comprising an insulating substrate, at least three rows of thermoelectric elements disposed on the substrate, a plurality of conductive elements, a first matrix terminal and a second matrix terminal, wherein the conductive elements are disposed on the substrate and operably connected to form a series connection of the thermoelectric elements from the first matrix terminal to the second matrix terminal;

wherein a set of first conductive elements have a first temperature and a set of second conductive contacts have a second temperature lower than the first temperature when a first current flows in a first direction between the first matrix terminal and the second matrix terminal, and wherein the folded matrix is configured to form spaced-apart alternating stacks of the first conductive contacts and second conductive contacts;

wherein each length of the yard or thread is interwoven such that it passes alternately under stacks of first conductive contacts and over stacks of second conductive contacts;

wherein each folded matrix includes the at least three rows of thermoelectric elements forming stacks of the thermoelectric elements, each stack having at least three thermoelectric elements; and wherein each stack of the at least three thermoelectric elements includes insulating material of the substrate disposed between each adjacent pair of the at least three thermoelectric elements in the stack.

2. The woven structure of claim 1, wherein the woven structure has a first side and a second side, and wherein each of a plurality of threads or lengths of yarns is woven such that in at least a portion of the woven structure, all of the first conductive contacts are nearer the first side than the second side, and all of the second conductive contacts are nearer the second side than the first side.

3. The woven structure of claim 1, wherein a first thermoelectric ribbon includes a plurality of the stacks of thermoelectric elements interleaved between a respective first conductive element of the set of first conductive elements and a respective second conductive element of the set of second conductive elements.

4. The woven structure of claim 3, wherein each of the plurality of stacks of thermoelectric elements is disposed at least in part laterally between adjacent lengths of yarn or thread.

5. The woven structure of claim 1, wherein each of the plurality of thermoelectric ribbons comprises a plurality of the folded matrices serially connected.

6. The woven structure of claim 1, wherein the substrate has a thickness of approximately 1 micron or less.

7. The woven structure of claim 1, wherein adjacent pairs of the plurality of thermoelectric ribbons interwoven with the yarn or thread extend in a substantially parallel manner.

8. The woven structure of claim 1, wherein adjacent stacks of the at least three thermoelectric elements are connected by a stack of at least three conductors.

9. A woven thermoelectric assembly, comprising:
a plurality of threads;
a plurality of thermoelectric ribbons interwoven with the plurality of threads, each of the plurality of thermoelectric ribbons forming a folded matrix, each folded matrix comprising,
a first flexible substrate having an array of thermoelectric elements, the array including a plurality of rows, each row having a plurality of the thermoelectric elements, at least two of the plurality of rows folded to form a stack of at least three of the plurality of rows, wherein each row has alternating p-type thermoelectric elements and n-type thermoelectric elements coupled in series, and wherein the rows are electrically serially connected;
wherein the plurality of thermoelectric ribbons are woven with the plurality of threads such that the threads create a vertical separation between a first side to a second side of each of the p-type thermoelectric elements and n-type thermoelectric elements;
wherein each folded matrix includes stacks of thermoelectric elements of the array of thermoelectric elements, each stack of thermoelectric elements having at least three thermoelectric elements; and
wherein each stack of the at least three thermoelectric elements includes insulating material of the substrate disposed between each adjacent pair of the at least three thermoelectric elements in the stack.

10. The woven structure of claim 9, wherein the first flexible substrate has a thickness of approximately 1 micron or less.

11. The woven structure of claim 10, wherein the first flexible substrate comprises polyethylene.

12. The woven structure of claim 10, wherein each of the n-type elements and p-type elements has a thickness in the range of 2 to 10 microns, and each thread has a diameter of 10 to 100 microns.

* * * * *